United States Patent [19]

Skoczen

[11] Patent Number: 5,627,497

[45] Date of Patent: May 6, 1997

[54] RESONATOR PACKAGE FOR ATOMIC FREQUENCY STANDARD

[75] Inventor: Gerold Skoczen, Chino Hills, Calif.

[73] Assignee: Efratom Time and Frequency Products, Inc., Irvine, Calif.

[21] Appl. No.: 602,987

[22] Filed: Feb. 16, 1996

[51] Int. Cl.⁶ .................................................. H03B 17/00
[52] U.S. Cl. .................................................. 331/94.1; 331/3
[58] Field of Search .............................. 331/94.1, 3, 67, 331/68, 69, 96, 107 DP; 333/209, 250, 256; 313/146, 148

[56] References Cited

U.S. PATENT DOCUMENTS

| | | | |
|---|---|---|---|
| 4,405,905 | 9/1983 | Busca et al. | 331/94.1 |
| 4,661,782 | 4/1987 | Weidemann | 331/3 |
| 4,947,137 | 8/1990 | Busca et al. | 331/3 X |
| 4,956,617 | 9/1990 | Bowlds | 331/107 DP X |

*Primary Examiner*—David Mis
*Attorney, Agent, or Firm*—Brinks Hofer Gilson & Lione

[57] ABSTRACT

A resonator package can comprise a microwave container which does not have to be tuned, such as an untuned waveguide, carrying an absorption cell and forming an optical path through its open end and the absorption cell and leading to a light detection means, and a microwave loop adjustably carried by the microwave container between the absorption cell and the light detection means. The microwave loop can be carried by a carrier slidably engaging a slot formed in the waveguide, and can be tuned by adjusting its position with respect to the adjacent face of the absorption cell. The resonator package can thus eliminate a microwave cavity and the need for the precise dimensions of a microwave cavity and the problems of separately tuning a microwave cavity and loop, and can permit smaller resonator assemblies without the use of dielectric loading and the use of a loop that also functions as a very simple and inexpensive microwave multiplier/mixer.

47 Claims, 5 Drawing Sheets

RESONATOR PACKAGE FOR ATOMIC FREQUENCY STANDARD

FIELD OF THE INVENTION

This invention relates to atomic frequency standards and more particularly relates to physics packages for atomic frequency standards, and still more particularly, to cavity-less resonator packages and their excitation means.

BACKGROUND OF THE INVENTION

Atomic frequency standards generate and maintain a standard frequency output by using the transition between two well-defined energy levels of an atom and the associated precise transition frequency to control the frequency of a frequency generating means. The atomic transition between two energy levels is employed as a highly stable frequency reference to which the frequency of a variable frequency oscillator, such as a voltage controlled oscillator can be electronically locked. The high stability and relative insensitivity to environmental perturbations that is associated with an atomic reference frequency is transferred to the variable frequency oscillator.

Hydrogen, cesium and rubidium frequency standards have been used to provide atomic controlled oscillators and standard frequencies, usually 5 megahertz (MHz) or 10 MHz. Such frequency standards have usually employed a voltage controlled oscillator, a physics package and associated electronics in an effort to maintain an accurate and stable standard frequency on a long-term basis. The physics package and associated electronics have been used to slave the voltage controlled oscillator to the frequency of the atomic transition, thereby reducing the drifting due to aging and environmental effects.

As well known in the art, physics packages have included resonator assemblies formed with a microwave cavity tuned to the atomic transition frequency, a closed transparent cell of atomic gas in the microwave cavity, means to inject microwave energy developed from the frequency of the voltage controlled oscillator into the microwave cavity, and a photodetector in the microwave cavity. An atomic light source in the physics package directs light into the microwave cavity of the resonator assembly to excite atoms of the atomic gas in the cell, and the light detector in the microwave cavity senses the intensity of light from the atomic light source that transits the atomic gas.

In such atomic frequency standards, atoms in the resonator assembly undergo hyperfine transition within a very narrow range of frequencies. For example, the hyperfine transition frequency, frequently referred to as the "atomic transition frequency" of rubidium (Rb 87) gas is nominally 6,834,687,500 Hz (6.834 . . . GHz) and a typical physics package has an atomic bandwidth of about 800 to about 2000 Hz. In order to lock the voltage controlled oscillator to the atomic transition frequency with the resonator assembly and to maintain a substantially unvarying standard frequency with the atomic transition frequency, a frequency-modulated microwave interrogation frequency is synthesized from the output frequency of the voltage controlled oscillator and is injected into the microwave cavity of the resonator assembly. The atomic gas within the transparent cell of the resonator assembly is excited by the incident light, the intensity of which is sensed by a photodetector to provide a physics package electrical output signal. The energy of the frequency-modulated microwave interrogation frequency injected into the microwave cavity interacts with the atomic gas within the transparent cell and varies the intensity of the light passing through the atomic gas in a manner dependent upon the difference between the injected microwave interrogation frequency and the atomic transition frequency, and the variation in light intensity is detected by the photodetector. The physics package thus provides a frequency discriminating electrical output signal that can be used to control the frequency of the voltage controlled oscillator.

Frequency modulation of an interrogation microwave frequency, within the atomic bandwidth of the atomic transition frequency, is used to determine if the interrogation microwave carrier frequency (which is a function of the standard frequency) is higher or lower than the atomic transition frequency, and a corrective signal is generated to correct the frequency of the voltage controlled oscillator and to lock it to the atomic transition frequency.

The resonator assembly of the physics package is thus the heart of an atomic frequency standard, and substantial efforts have been directed by workers in the field to modify atomic frequency standard physics packages and resonator assemblies to improve their operating characteristics, to reduce their size and cost, and to improve their manufacturability without deleteriously affecting their operation.

The resonator assembly of one such physics package being manufactured and sold by Datum/Efratom Time and Frequency Products, Inc., is shown in FIGS. 1 and 2. The resonator assembly of the Efratom physics package includes a microwave cavity 100 defined by a body 100a, encompassing an absorption cell 110, and a cavity lid 100b, which carries a microwave loop 120, a tuning screw 130 for the microwave loop, and a light detector 140. The lid 100b for the microwave cavity 100 is usually tilted in forming the microwave cavity, as shown in FIG. 2, to tune the microwave cavity 100 for proper operation. The microwave loop 120 consists of a series combination of a feed-through capacitor 120a, a carbon resister 120b, step-recovery diode 120c, and the portion 120d of the lid 100b forming the microwave cavity 100. An approximate submultiple of the atomic transition frequency is supplied to the microwave loop 120 through the feed-through capacitor 120a by a microwave cable (not shown) from the frequency generator of the atomic frequency standard.

In manufacturing the microwave cavity 100 shown in FIGS. 1 and 2, the microwave loop 120 and microwave cavity 100 are coarsely tuned by moving the lid 100b inside the microwave cavity body 100a, and fine tuning of the microwave loop 120 is accomplished by adjustment of the tuning screw 130. In such physics packages, the width of the microwave loop is generally greater than its height above the ground plane (i.e., the internal surface of the lid 100b), such microwave loops being typically about 0.290 inch wide and about 0.200 inch high. The advantage of this loop is that it also functions as a microwave multiplier and mixer using only three electronic components: a step recovery diode 120c, a capacitive feed-through 120a and a resistor 120b. It would be very difficult indeed to make a simpler or less expensive device that performs all of these functions simultaneously.

U.S. Pat. No. 4,405,905 to Busca, et al. discloses, as illustrated by FIG. 2 of Busca, et al., a physics package for an atomic frequency standard including excitation means comprising a microwave loop 5 which encircles an absorption cell 4 within the physics package to decrease the time constant of the physics package by broadening the width of the microwave absorption line of the absorption cell. The absorption cell 4 of Busca's disclosure has no buffer gas and includes a special absorption cell wall coating providing a "non-disorienting" layer. Busca, et al. state that the use of the cell-encircling microwave loop 5 permits the elimination of a microwave cavity and makes it possible to substantially reduce the volume of the absorption cell and to eliminate the necessity to tune the cavity and cell in the production of atomic frequency standards. The elimination of the microwave cavity is said to provide a variable phase (traveling wave) field in the absorption cell as contrasted with the constant phase (standing wave) field obtained with the use of microwave cavities.

BRIEF DESCRIPTION OF THE INVENTION

This invention provides an improved resonator package for an atomic frequency standard without a microwave cavity and without the problems of separately tuning a microwave cavity and a microwave loop which are coupled. The resonator package of the invention can thus eliminate the need for the precise dimensions of a microwave cavity and the adjustable lids and tuning screws previously used, and can permit smaller resonator packages without the use of dielectric loading, and the use of absorption cells with buffer gases of the type previously used, and the use of the electronics of existing frequency generators and control systems.

In the invention, a resonator package can comprise a container for the microwave energy which does not have to be tuned and which can also function as a physics package oven and/or magnetic shield. The microwave container can be an untuned waveguide, open or partially open at one end, carrying an absorption cell, and in some embodiments, a filter cell, and forming an optical path through its open end and the filter cell and absorption cell to a light detection means, and adjustably carrying a microwave energizer, which also functions as a multiplier/mixer, that is preferably located between the absorption cell and the light detection means, but may also be placed in close proximity to any side of the absorption cell. In embodiments using a filter cell, the filter cell will be interposed between the open end and the absorption cell. The microwave energizer can be carried by a plate slidably engaging a slot formed in the waveguide, and can be tuned by adjusting its position with respect to the adjacent face of the absorption cell. (Alternatively, the microwave energizer may be fixed relative to the microwave container and tuning accomplished by moving the absorption cell relative to the microwave energizer.) In the invention, a removable microwave energizer can preferably comprise a conductive carrier adapted to engage the sides of the slotted microwave container and to carry a narrow bandwidth microwave loop, which can comprise a step-recovery diode and resistor, which extend perpendicularly with respect to the conductive carrier and generally parallel to each other in a plane generally perpendicular to the optical path of the microwave container and are connected at their distal ends to form a microwave loop having greater height than width and a circumference of about one-half wavelength of the microwave exciting frequency in free space.

As used in this invention a "microwave container" can be any means for providing an electrically conductive surface for substantial containment of the microwave energy generated within the microwave container, for example, any electrically conductive surface configuration in which the amplitude of the escaping field is about 10 percent or less of the amplitude of the field generated at the microwave loop, and where such a microwave container is "untuned", that is it has no modes that are resonant at the atomic resonant frequency of the atomic gas it carries and any microwave resonance it demonstrates differs significantly from such an atomic resonance frequency.

Other features and advantages of this invention will be apparent from the drawings and more detailed description that follow.

BRIEF DESCRIPTION OF THE DRAWINGS

FIG. 9 being a view from above FIG. 8; and FIG. 10 being a view from the right of FIG. 8.

DETAILED DESCRIPTION OF THE INVENTION

Figure 1:
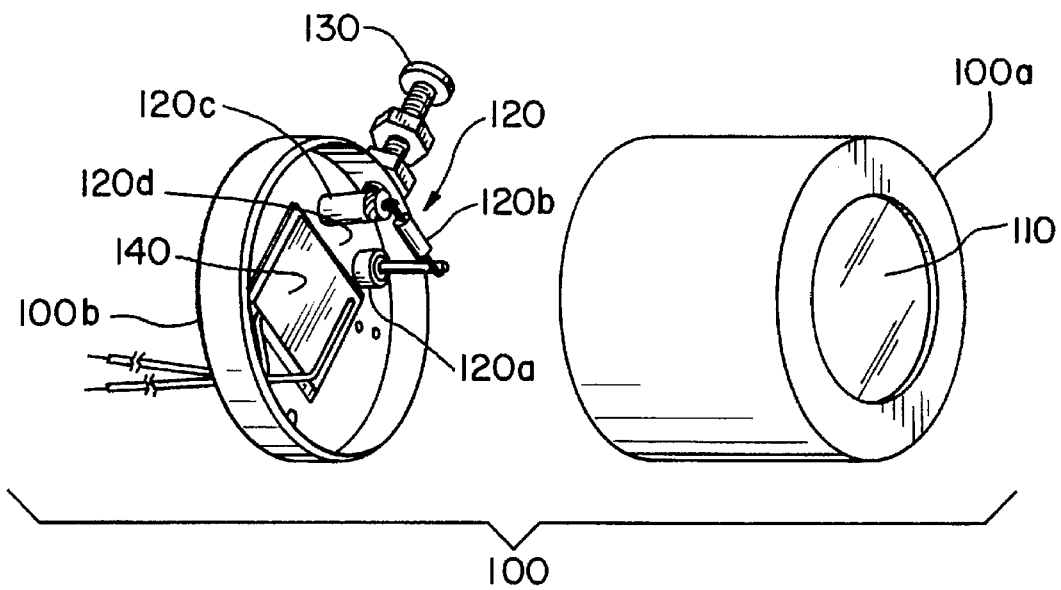
FIG. 1 is a perspective exploded drawing of a prior art microwave cavity for a resonator package.
Figure 2:
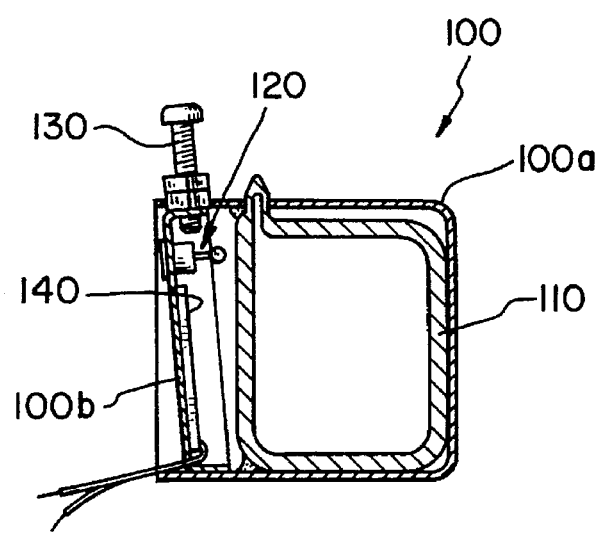
FIG. 2 is a cross-sectional drawing of the assembled microwave cavity of FIG. 1.
Figure 3:
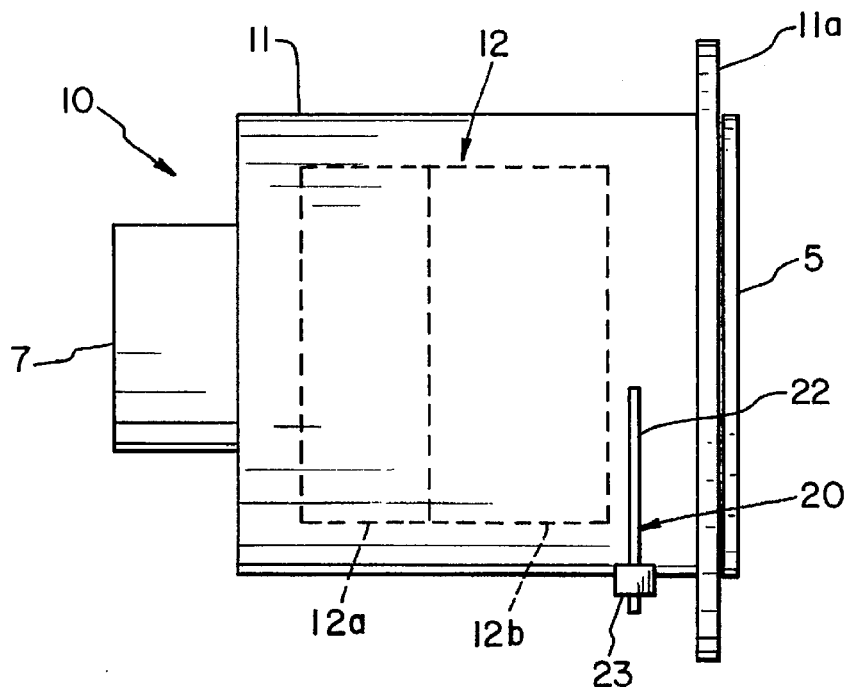
FIG. 3 is a diagrammatic view of the resonator package showing the relative placement of components.

FIG. 3 diagrammatically illustrates a resonator package 10 incorporating the present invention. The resonator package 10 includes a microwave container 11, a light source 7 that can include a rubidium lamp or a laser or the like, and light detection means 5 coupled to a flange 11a of the microwave container 11. The microwave container 11 preferably encloses an absorption cell 12 that combines, as well known in the art, isotopic light filtering, optical pumping and microwave atomic resonance, and can enclose separate filter and absorption cells 12a, 12b in embodiments where a separate filter cell is used. A microwave exciter 20 is disposed generally adjacent the absorption cell 12 between the absorption cell 12 and a light detection means 5. A light source 7 is positioned at the opposite end of a microwave container 11 from the light detection means 5 and transmits light through the filter cell (if present) and the absorption cell 12 to the light detection means 5.

Figure 4:
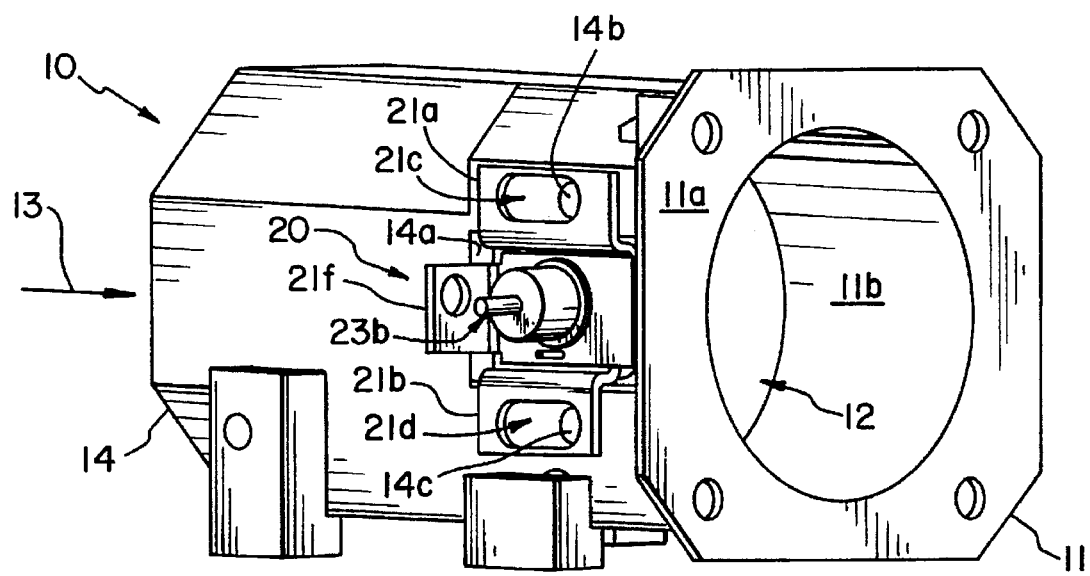
FIG. 4 is a perspective view of a resonator package of the invention, with its light detector means removed, illustrating the manner in which its microwave exciter means is carried.
Figure 5:
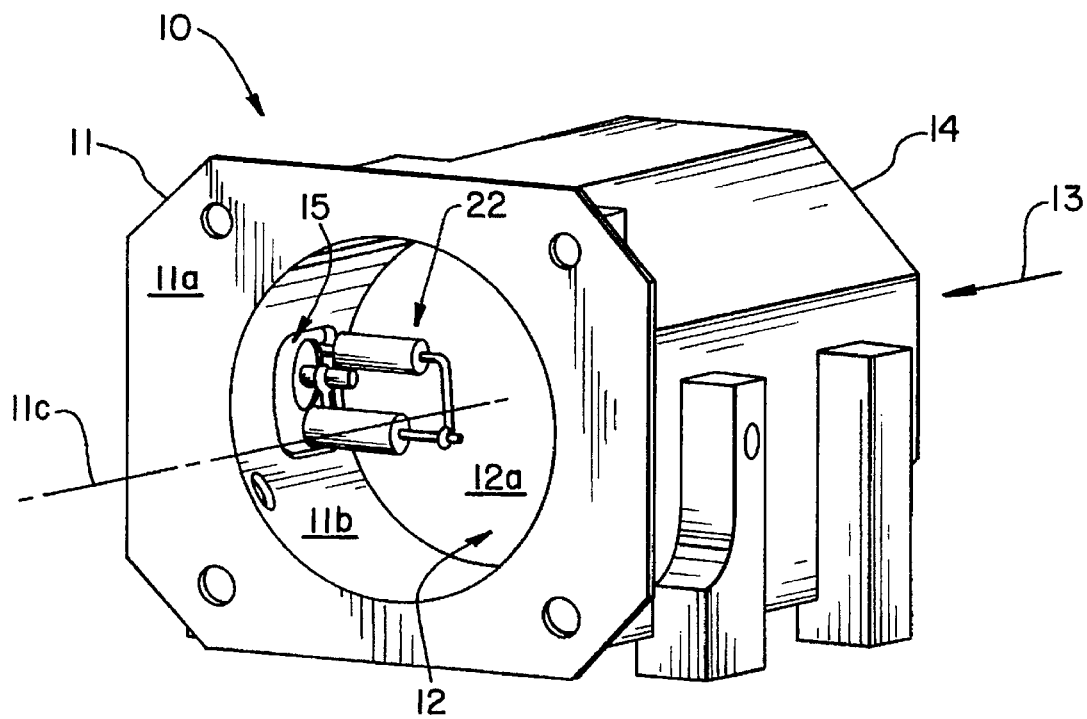
FIG. 5 is a perspective view of the resonator assembly of FIG. 4 with its light detection means removed, illustrating the microwave exciter within the container.
Figure 6:
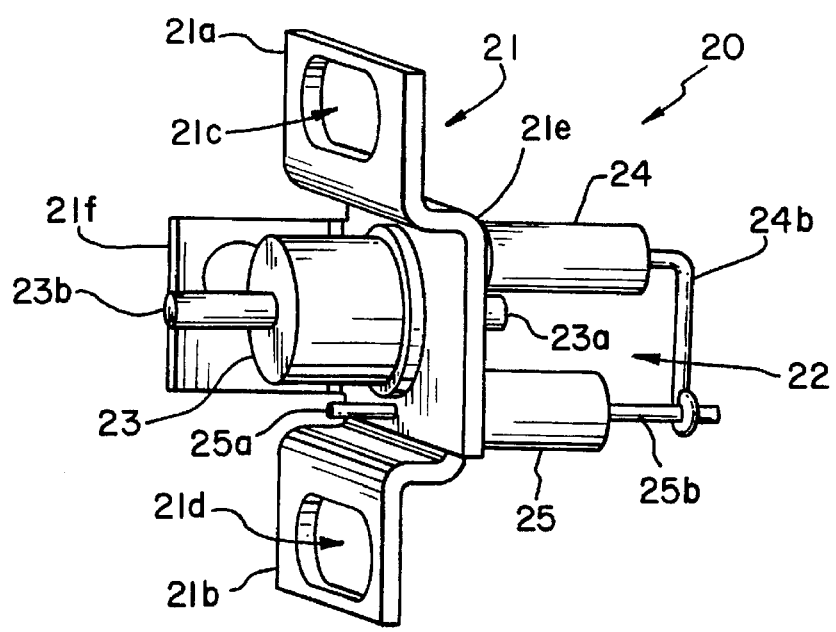
FIGS. 6 and 7 are perspective views of a microwave exciter of the invention.

Although the preferred embodiment of the invention shown in FIGS. 4 and 5 includes, as a light detection means 5, a photodetector (such as a photo diode or other component generating an electrical signal related to the intensity of the light to which it is exposed) which is carried at the end 11a of the microwave container, the light detection means and its carrier are not shown in FIGS. 4 and 5 to permit the optical path and interior of the microwave container 11 to be illustrated. The light detection means 5 used with the resonator package 10 of this invention can include light detectors optically connected to the optical path formed by the microwave container 11 by any effective light transmitting means, such as optical fibers and conduits. For example, an optical conduit may be connected to flange 11a of the microwave container 11 rather than a photodetector and its carrier, to permit location of the light detection means remotely from the resonator assemblies 10.

FIGS. 4 and 5 illustrate a resonator package 10 of the invention. The resonator package 10 comprises an untuned microwave container 11 formed from mu metal to provide magnetic shielding for the contents of the container. In the embodiment shown in FIGS. 4 and 5, the microwave container 11 comprises a flange 11a which is adapted to carry a light detection means 5 (removed from FIGS. 4 and 5 to better illustrate the interior of microwave container). The microwave container 11 further comprises a cylindrical wall 11b to substantially contain the microwave energy, define an optical path including an absorption cell 12, and magnetically shield the contents of the microwave container from external magnetic fields. To the left of FIG. 4 and to the right of FIG. 5, the end of the microwave container 11 is formed with a hole (not shown) to permit light, indicated by arrows 13, to enter the microwave container for transmission through a filter cell 9, if used, and absorption cell 12 to light detection means 5 (not shown) carried by, or optically connected to, the flange 11a of the microwave container in FIGS. 4 and 5.

Figure 11:
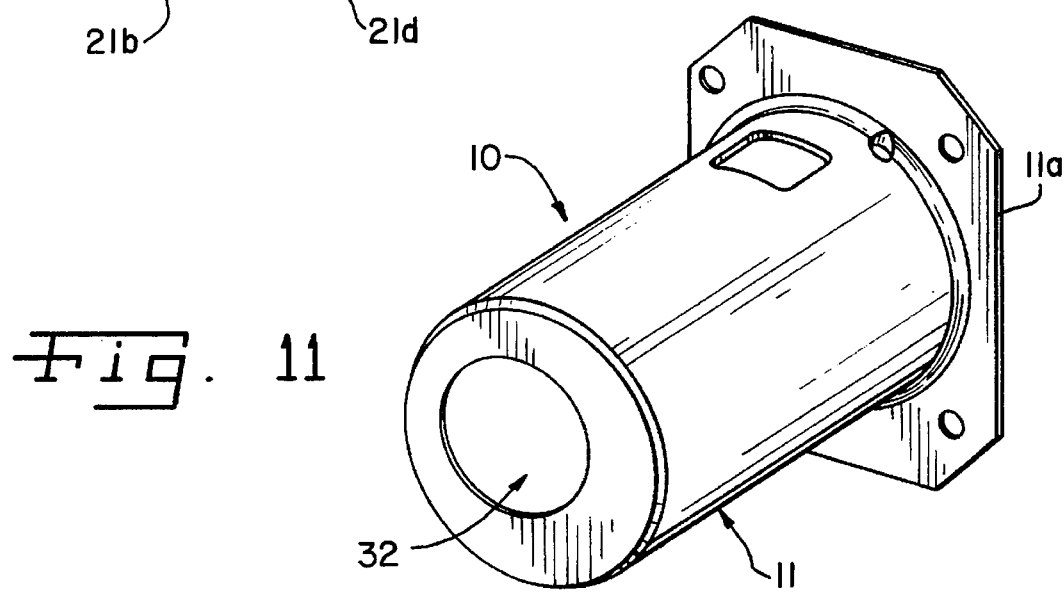
FIG. 11 is a perspective view of an alternative embodiment of the microwave container with an eccentric hole formed in one end.
Figure 12:
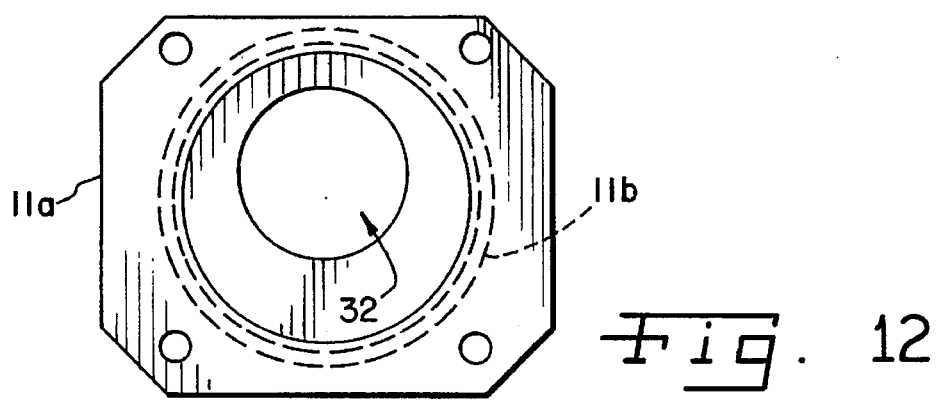
FIG. 12 is an end view of the microwave container of FIG. 11 showing the eccentricity of the hole.

It has been determined that, when using an open-ended microwave container, electrical interference from the lamp can adversely affect the operation of the microwave loop. Thus, in preferred embodiments, the end of the microwave container 11 is closed, but includes a hole 32, eccentric to the longitudinal axis of the microwave container in the embodiment illustrated in FIGS. 11 and 12. The hole admits light but eliminates the adverse effects of the electrical interference from the lamp. Alternatively, the end of the microwave container 11 can be open but incorporate the use of "crosshair" wires or the like across the opening to eliminate the interference, and it is not necessary that the hole be eccentric.

In the embodiment shown in FIGS. 4 and 5 the sleeve 11b of the microwave container 11 is surrounded by an aluminum housing 14 whose temperature is controlled, in a manner well known in the art, by heating means to maintain the contents of the microwave container 11, most notably the absorption cell 12, within a desirable temperature range.

As most clearly illustrated in FIG. 5, the sleeve 11b of the microwave container and the oven housing 14 are formed to provide a slot 15 opening within the microwave container 11 between the absorption cell 12 and the flange 11a which normally carries the light detection means. As illustrated in FIG. 5, the slot 15 extends along the resonator assembly 10 between the absorption cell 12 and the flange 11a which carries the light detection means. As will be apparent to those skilled in the art, that portion of the light 13 which is not absorbed in the absorption cell will travel on an optical path generally along the central axis 11c of the interior walls 11b of the microwave container 11.

FIGS. 4 and 5 illustrate the manner in which a microwave exciter 20 of the invention is adjustably carried by the resonator apparatus 10 within slot 15, and FIGS. 6–10 illustrate a preferred microwave exciter 20 of the invention.

As illustrated in FIGS. 4–10, the microwave exciter 20 of this invention includes a conductive carrier 21 that carries a microwave loop 22 extending generally perpendicularly from the conductive carrier 21. As illustrated in FIGS. 3–5, when the conductive carrier 21 of the microwave exciter 20 is carried by the resonator assembly 10, the microwave loop 22 extends within the microwave container 11 between the absorption cell 12 and the light detection means 5 which is mounted to flange 11a. As further illustrated by FIGS. 3 and 5, particularly in conjunction with FIGS. 6–10, the planes in which the microwave loop 22 can extend traversely into the interior of microwave container 11 formed by its wall 11b, and preferably, these planes are substantially perpendicular to the central axis 11c of the microwave container 11.

In the invention, the microwave exciter 20 is movable along the optical path of the microwave container, for example, along a path parallel to the central axis 11c of the microwave container 11, between the face of the absorption cell 12a and the light detection means 5 mounted to flange 11a of the microwave container 11. Adjustment of the position of the microwave exciter 20 and the microwave loop 22 that it carries within the slot 15 effects tuning of the microwave loop 22. Since a preferred microwave loop 22 includes a step-recovery diode 25, it also functions as a multiplier-mixer to produce the microwave excitation frequency.

As noted above, the microwave container itself is untuned and has no modes that are resonant at the atomic resonance frequency of the atomic gas carried by the absorption cell, and any microwave resonance that the microwave container may demonstrate differs significantly from such an atomic resonant frequency. Thus, resonator assemblies 10 of the invention are easily tuned by adjustment of the position of the microwave exciter 20 on the resonator assembly 10.

In the embodiment illustrated and described, the housing 14 is provided with an elongated slot 14a into which the conductive carrier 21 of the microwave exciter 20 may be fitted, as illustrated in FIG. 4. In addition, the housing 14 is provided with a pair of threaded holes 14b and 14c to accept a pair of screw fasteners for the microwave exciter 20. The conductive carrier 21, as illustrated in FIG. 4 and FIGS. 6–10, is formed with a pair of flanges 21a and 21b which are formed with slots 21c and 21d, respectively. In the embodiment shown, the central portion of the conductive carrier 21 includes a portion 21e bent out of the plane of the flanges 21a and 21b and forming a slot-engaging central portion 21e that carries microwave loop 22 within the microwave container 11. The conductive carrier 21 is also provided with an upturned tab 21f which extends in the resonator assembly 10, outwardly away from the housing 14. Not shown in any of the figures is a coaxial cable which carries the rf signal that drives the combination loop/multiplier mixer 22. The purpose of tab 21f is to provide a point of electrical attachment for the shield of this coaxial cable, said coax passing through the hole in the tab 21f and having said shield soldered to tab 21f. Tab 21f also provides a convenient handle by which the microwave loop 22 can be tuned by adjustment of its position within the slot 15.

Figure 7:
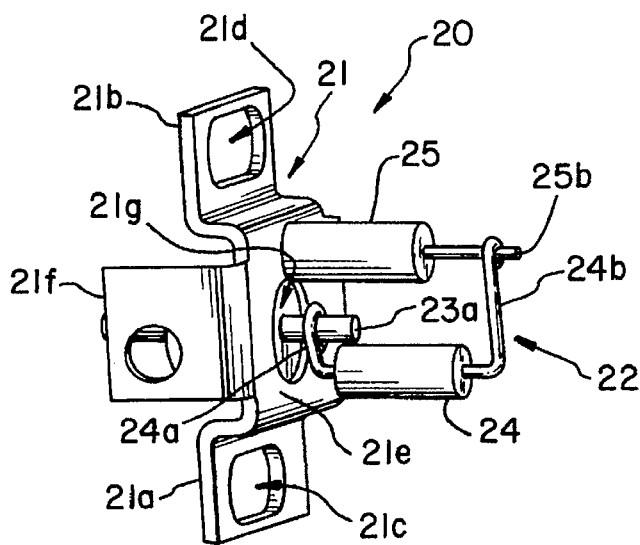
Figure 8:
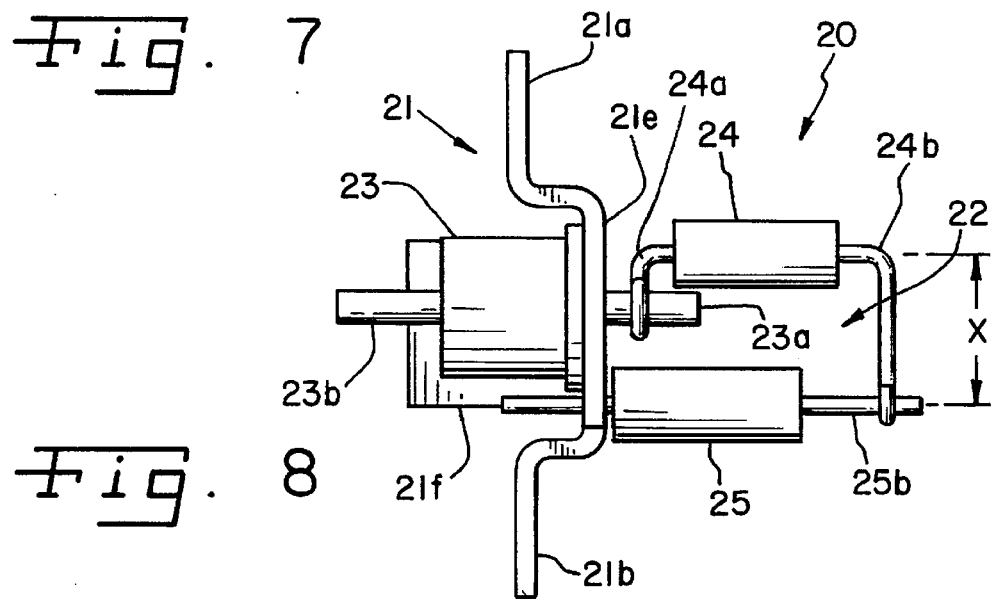
FIGS. 8–10 are othogonal views of a microwave exciter corresponding to that illustrated in FIGS. 4–7, with FIG. 8 being a view from the side of the microwave exciter.
Figure 9:
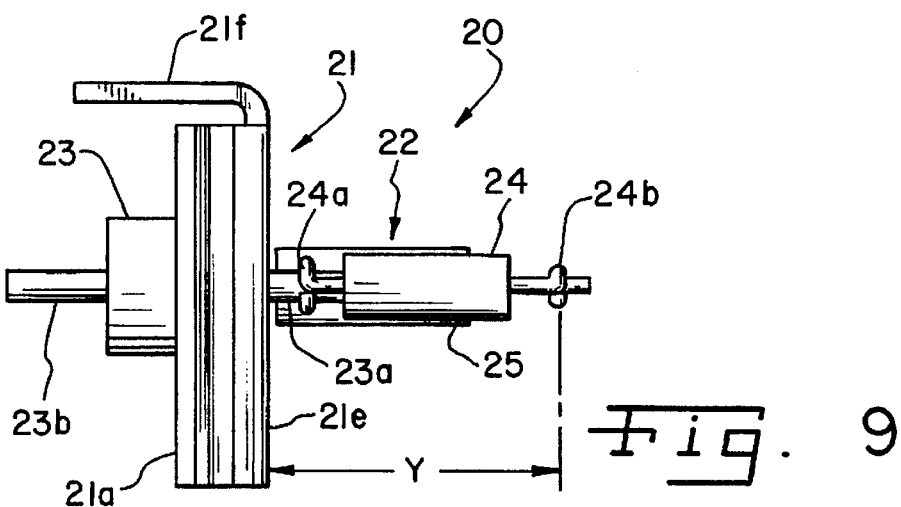
Figure 10:
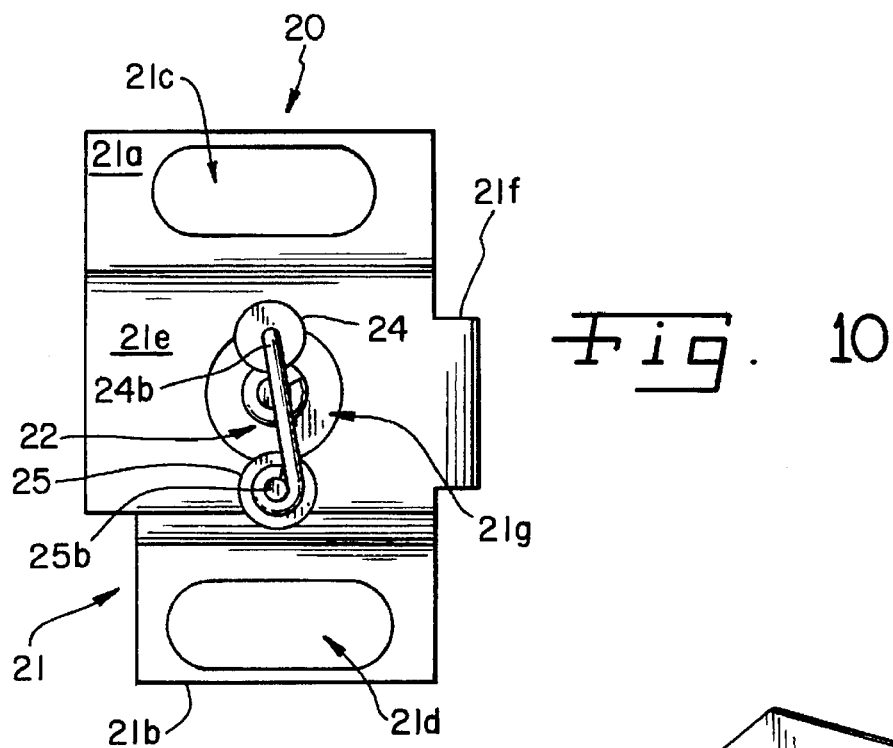

As further illustrated in the drawings, the microwave loop 22 is comprised of a feed-through capacitor 23, a resistor 24, and a step-recovery diode 25. Feed-through capacitor 23 is fastened to the central portion 21e of the conductive carrier 21 so that one of its terminals 23a extends outwardly from the inner face of the central portion 21e as best shown in FIGS. 5, 7 and 8. It should be noted that the central portion 21e of the conductive carrier 21 is formed with an opening 21g, as shown in FIGS. 5, 7 and 10, to permit microwave energy to be applied to the microwave loop 22. As indicated in FIGS. 5–10, resistor 24 has one end 24a that is soldered or welded to the internal lead 23a of the feed-through capacitor 23 and bent in such a fashion that the resistor 24 extends substantially perpendicularly from the conductive carrier 21. As further illustrated in the drawings, the distal end 24b of resistor 24 is connected to the distal end 25b of step-recovery diode 25. Step-recovery diode 25 is electrically connected to and carried by the central portion 21e of conductive carrier 21 so that when the microwave exciter 20 is mounted on the resonator assembly 10 its connection 25a is at microwave ground. Step-recovery diode 25 and its connection 25b extend substantially perpendicularly from the central portion 21e of the conductive carrier 21, and the connection 24b from resistor 24 lies substantially parallel with the central portion 21e and is fastened by soldering or welding to the connection 25b substantially at a right angle, as shown in FIGS. 5–8. The microwave loop 22 formed by the resistor 24 and step-recovery diode 25 and their interconnection 24b is generally planar, as indicated by FIG. 10. As indicated in the drawings, particularly FIG. 5, the microwave exciter 20 can be slidably carried in the slot forming means of the resonator assembly 10 in such a manner that the microwave loop 22 lies generally in planes substantially parallel to one face 12a of the absorption cell 12.

As connected, the feed-through capacitor 23, resistor 24, step-recovery diode 25 and central portion 21e of the conductive carrier form microwave loop 22 with a width X (FIG. 8) between the resistor 24 and step-recovery diode 25 less than its height Y (FIG. 9) between the central portion 21e of the conductive carrier and the connection 24b at the distal ends of resistor 24 and step-recovery diode 25. Thus, microwave loop 22 extends perpendicularly from said conductive carrier 21 a distance greater than the transverse distance between the resistor 24 and step-recovery diode 25. In a preferred microwave exciter the distance X between the center lines of the resistor 24 and the step-recovery diode 25 is about 0.15 inches and the height Y between the conductive carrier portion 21e and connection portion 24b of the microwave loop is about 0.26 inches. The microwave exciter 20 comprises a narrow band microwave loop 22 having a circumferential length of about one-half wave length of the atomic resonance frequency in free space.

In assembling microwave exciter 20 into the resonator assembly 10, the microwave exciter is placed on the resonator assembly 10 with the microwave loop 22 extending through the slot 15. As indicated in FIG. 4, the housing 14 is provided with a slot 14a adjacent to slot 15 and extending along and generally parallel to the central axis 11c of the microwave container 11. As assembled, the central portion 21e of the conductive carrier 21 of the microwave exciter 20 extends into the slot 14a formed in the housing 14, and the flange portions 21a and 21b lie generally parallel to the face of the housing 14 with their slots 21c and 21d lying over the threaded holes 14b and 14c in the housing 14. When the microwave exciter 20 has been placed in position on the resonator assembly 10, screw fasteners are threaded into the threaded holes 14b and 14c of the housing 14 so that the microwave exciter 20 is carried on the resonator assembly 10 loosely enough to permit it to be moved back and forth along the axis 11c of the microwave container 11, for example, by pushing or pulling on the tab 21f.

Slot 15 has a length of about 0.21 inches in the direction of the central axis 11c of the microwave container 11 and width of about 0.21 inches in the perpendicular direction. The central portion 21e of the conductive carrier 21 has a width of about 0.25 inches, and the length of the central portion 21e in the direction of the central axis 11c is about 0.35 inches. Thus when in place on the resonator assembly 10, the conductive carrier 21 of microwave exciter 20 substantially closes slot 15 with a central portion 21e. The connected interface and capacitative coupling between the conductive carrier 21 and the adjoining surfaces of the housing 14 and microwave container 11, which is an rf ground, provide a substantial zero impedance short circuit for rf energy at the periphery of slot 15 thereby making oven 14 and microwave container 11 an rf ground.

The rf energy which excites the combination loop/multiplier/mixer 22 is delivered to the latter, as mentioned previously, by a coaxial cable (not shown). The center conductor of this cable is connected to connection 23b of the feed-through capacitor 23 and the shield to tab 21f of exciter 20 in the manner described previously. Of course, a light detecting means 5 will be attached to resonator assembly 11 at the flange 11a for operation of the resonator assembly 10. So assembled, microwave exciter 20 is tuned by adjusting the position of the microwave exciter 20 within slot 15 by moving it back and forth between the face of the absorption cell 12a and the light detection means 5 generally in the direction of the central axis 11c of the microwave cavity. When the microwave exciter 20 is properly tuned to the exciting frequency, the threaded fasteners in holes 14b and 14c are tightened, clamping brackets 21a and 21b to the housing 14, thereby fixing the microwave exciter 20 in its properly tuned position.

The invention thus provides an improved resonator package for an atomic frequency standard without a microwave cavity and without the problems of separately tuning a microwave cavity and a microwave loop which are coupled. As noted above, the resonator package includes an untuned microwave container, thus eliminating the precise dimensions of a microwave cavity and the adjustable lids and tuning screws previously used. The invention permits smaller resonator packages without the use of dielectric loading and the use of absorption cells with buffer gases of the type previously used. In the invention, the microwave loop 20 is adjustably carried by the untuned microwave waveguide between the absorption cell 12 and the light detection means 5 by a plate 21 slidably engaging a longitudinal slot formed in the resonator assembly.

While the presently known best mode of carrying out the invention is shown and described above, those skilled in the art will understand that other embodiments may be made within the scope of the invention as established by the scope of the claims that follow and the prior art.

What is claimed is:

1. In a resonator package for an atomic frequency standard, comprising a microwave container forming a light window at one end and a connection for light detection means, and an absorption cell and microwave exciter for said absorption cell carried within said microwave container wherein the improvement comprises a microwave container that is untuned, and the microwave exciter for said absorption cell is carried by said microwave container.

2. The resonator package of claim 1 wherein a light detection means is located remotely from the resonator package and an optical conduit is connected to said light connection of said microwave container and extends to said light detection means.

3. The resonator package of claim 1 wherein a light detection means is carried by said microwave container adjacent said light connection.

4. The resonator package of claim 1 wherein said microwave container is formed with a longitudinal slot between said light detection means and said absorption cell, and said microwave exciter is located between said absorption cell and said light connection, and is slidably carried by the slot forming means of said container.

5. The resonator package of claim 4 wherein said exciter for said absorption cell comprises a conductive carrier adapted for engagement with the slot forming means of said container and carrying a feed-through capacitor and a resistor extending perpendicularly from the conductive carrier and further carrying a step-recovery diode extending perpendicularly from the conductive carrier and generally parallel to the resistor, said resistor and step-recovery diode being joined at their distal ends to form a microwave loop.

6. The resonator package of claim 5 wherein said microwave loop extends perpendicularly from said conductive carrier a distance greater than the transverse distance between said resistor means and step-recovery diode.

7. The resonator package of claim 1 wherein said microwave container comprises an open-ended waveguide with said light window at its open end.

8. The resonator package of claim 1 wherein the untuned, microwave container provides magnetic shielding.

9. The resonator package of claim 1 wherein said untuned, microwave container is heated to control the temperature of the absorption cell.

10. The resonator package of claim 6 wherein the microwave loop lies generally in a plane generally parallel to one end of the absorption cell.

11. The resonator package of claim 1 wherein the microwave exciter includes a multiplier/mixer.

12. The resonator package of claim 1 further comprising a separate filter cell carried within said microwave container.

13. A resonator package for an atomic frequency standard including a microwave container forming an optical axis and further including a microwave exciter, an absorption cell, and a light detector, said microwave container being an untuned waveguide with the light detector adjacent one end, and said microwave exciter being a microwave loop adjustably carried by the untuned, waveguide between the light detector and the absorption cell.

14. The resonator package of claim 13 wherein the untuned waveguide provides magnetic shielding.

15. The resonator package of claim 13 wherein said untuned waveguide is heated to control the temperature of the absorption cell.

16. The resonator package of claim 13 wherein the microwave loop lies generally in a plane perpendicular to the optical path of the untuned waveguide and generally parallel to one end of the absorption cell.

17. The resonator package of claim 13 wherein the microwave loop comprises a feed-through capacitor, and a resistor and step-recovery diode extending parallel with each other and in a plane generally perpendicular to the optical axis of the untuned waveguide, said resistor and step-recovery diode being joined at their distal ends in forming the microwave loop.

18. The resonator package of claim 17 wherein the feed-through capacitor, resistor and step-recovery diode are carried at their other ends by a carrier plate including a portion forming part of the microwave loop.

19. The resonator package of claim 18 wherein the untuned waveguide includes a slot between the light detector and absorption cell, and the carrier plate slidably engages the untuned waveguide adjacent the slot.

20. The resonator package of claim 19 wherein the carrier plate and the slot-forming portion of the waveguide engage sufficiently to form a substantially impedance-less rf and/or microwave connection at their interface.

21. The resonator package of claim 19 wherein the transverse distance between the step-recovery diode and resistor is less than the distance between their distal ends and the microwave container.

22. The resonator package of claim 19 wherein the slot has a length along the optical axis of the waveguide of about 0.21 inches and the conductive carrier has a length of about 0.35 inches.

23. The resonator package of claim 13 wherein the microwave loop includes a multiplier/mixer.

24. The resonator package of claim 13 wherein the untuned waveguide is open-ended.

25. The resonator package of claim 13 further comprising a filter cell carried within the microwave container.

26. A resonator for an atomic frequency standard, comprising an untuned microwave container, an absorption cell containing an atomic gas carried within said untuned microwave container and a narrow band microwave loop movably carried by said untuned microwave container and tunable by movement with respect to said absorption cell.

27. The resonator of claim 26 wherein said microwave loop has a circumferential length of about one-half wavelength of the atomic resonance frequency of the atomic gas in free space.

28. The resonator of claim 26 wherein said microwave loop extends substantially in a plane parallel to a face of the absorption cell.

29. The resonator of claim 28 wherein said microwave loop comprises a step-recovery diode and resistor extending generally parallel to each other and to the face of the absorption cell, said step-recovery diode and resistor being interconnected adjacent the untuned microwave container, in part, by a feed-through capacitance and being connected together directly at their distal ends to form the microwave loop.

30. The resonator of claim 29 wherein the transverse distance between the step-recovery diode and resistor is less than the distance between their distal ends and the microwave container.

31. The resonator package of claim 26 wherein the untuned, microwave container provides magnetic shielding.

32. The resonator package of claim 26 wherein said untuned, microwave container is heated to control the temperature of the absorption cell.

33. The resonator package of claim 26 further comprising a filter cell carried within the microwave container.

34. A resonator for an atomic frequency standard, comprising,
   a microwave container adapted for transmission of light along an optical axis,
   an absorption cell located within said microwave container along said optical axis and containing an excitable atomic gas;
   a light detector optically connected to said microwave container for receipt of light from said absorption cell, and
   a microwave exciter, said microwave container being tunable by changing the distance separating the absorption cell and the microwave exciter.

35. The resonator of claim 34 wherein said microwave exciter is carried by said microwave container and is slidable in a direction parallel to said optical axis to change said separating distance.

36. The resonator of claim 34 wherein said microwave exciter is removable from said microwave container.

37. The resonator of claim 34 wherein said microwave exciter comprises a narrow band microwave loop.

38. The resonator of claim 37 wherein the narrow band microwave loop has a circumferential length of about one-half wavelength of the atomic resonant frequency in free space of the atomic gas in said absorption cell.

39. The resonator of claim 37 wherein the plane of said microwave loop is substantially perpendicular to the optical axis of said microwave container.

40. The resonator of claim 37 wherein said microwave loop comprises a feed-through capacitance, a step-recovery diode, a resistor and a conductive carrier portion.

41. The resonator of claim 37 wherein said microwave container includes a portion forming a slot adjacent its optical axis, said microwave loop is carried by a conductive plate within the slot formed in the microwave container, and said conductive plate is sufficiently capacitively coupled to the slotforming portion of said microwave container to provide substantially an rf and/or microwave short between the conductive plate and the slot-forming portion of the microwave container.

42. In a resonator package for an atomic frequency standard, comprising a microwave container including a light detection means adjacent one end and a light window at the other end, and an absorption cell and a microwave exciter carried within said microwave container, the improvement wherein the microwave container is untuned, and the microwave exciter for said absorption cell, is carried by said microwave container between said absorption cell and said light detection means.

43. The resonator package of claim 42 wherein said microwave container is formed with a longitudinal slot between said light connection and said absorption cell, and said microwave excitation means is slidably carried by the slot forming means of said container.

44. The resonator package of claim 43 wherein said microwave excitation means extends into the microwave container generally in planes substantially parallel to one face of the absorption cell.

45. The resonator package of claim 42 further comprising a filter cell located within said microwave container along said optical axis.

46. A resonator package for an atomic frequency standard comprising:

an untuned microwave container forming a light window at one end and a light connection at the other end for light detection means, an absorption cell carried within said microwave container; and means for multiplying and mixing signals for exciting said absorption cell, said multiplying and mixing means being carried by said microwave container between said absorption cell and said light detection means.

47. The resonator package of claim 1 wherein said absorption cell is adjustably carried by said microwave container to allow relative movement between said absorption cell and said microwave exciter.

\* \* \* \* \*

UNITED STATES PATENT AND TRADEMARK OFFICE
CERTIFICATE OF CORRECTION

PATENT NO. : 5,627,497
DATED : May 6, 1997
INVENTOR(S) : Gerold Skoczen

It is certified that error appears in the above-indentified patent and that said Letters Patent is hereby corrected as shown below:

Col. 2, line 36, change "resister 120b" to --resistor 120b--.

Col. 4, line 28, delete "and".

Col. 6, line 45, change "loop/multiplier mixer 22" to --loop/multiplier-mixer 22--.

Col. 7, line 62, change "Thus when" to --Thus, when--.

Col. 8, lines 4-5, change "loop/multiplier/mixer 22" to --loop/multiplier-mixer 22--.

Signed and Sealed this

Eleventh Day of November, 1997

Attest:

BRUCE LEHMAN

Attesting Officer      Commissioner of Patents and Trademarks